United States Patent [19]
Winer et al.

[11] Patent Number: 5,923,086
[45] Date of Patent: Jul. 13, 1999

[54] APPARATUS FOR COOLING A SEMICONDUCTOR DIE

[75] Inventors: Paul Winer, Santa Clara; Mario J. Paniccia, Sunnyvale, both of Calif.; Karl J. Ma, Chicago, Ill.

[73] Assignee: Intel Corporation, Santa Clara, Calif.

[21] Appl. No.: 08/856,267

[22] Filed: May 14, 1997

[51] Int. Cl.[6] .............................. H01L 23/34; H01L 23/10
[52] U.S. Cl. ......................... 257/713; 257/707; 257/714
[58] Field of Search ............................. 257/714; 361/689, 361/99, 701, 217, 711, 712

[56] References Cited

U.S. PATENT DOCUMENTS

| | | | |
|---|---|---|---|
| 3,654,528 | 4/1972 | Barkan | 317/234 R |
| 3,990,100 | 11/1976 | Mamine et al. | 357/30 |
| 4,168,113 | 9/1979 | Chang et al. | 351/166 |
| 4,529,685 | 7/1985 | Borodovsky | 430/311 |
| 4,582,954 | 4/1986 | Eaton et al. | 174/16 HS |
| 4,617,252 | 10/1986 | Cordes, III et al. | 430/272 |
| 4,649,992 | 3/1987 | Geen et al. | 165/185 |
| 4,672,422 | 6/1987 | Schierz | 357/82 |
| 5,000,256 | 3/1991 | Tousignant | 165/46 |
| 5,001,548 | 3/1991 | Iversen | 357/82 |
| 5,004,307 | 4/1991 | Kino et al. | 350/1.2 |
| 5,061,568 | 10/1991 | Kessel et al. | 428/437 |
| 5,070,040 | 12/1991 | Pankove | 437/209 |
| 5,106,786 | 4/1992 | Brady et al. | 437/229 |
| 5,146,314 | 9/1992 | Pankove | 357/82 |
| 5,243,458 | 9/1993 | Hatano et al. | 359/359 |
| 5,285,351 | 2/1994 | Ikeda | 361/699 |
| 5,354,717 | 10/1994 | Pollock et al. | 437/225 |
| 5,376,325 | 12/1994 | Buchmann et al. | 437/209 |
| 5,418,019 | 5/1995 | Chen et al. | 427/579 |
| 5,463,528 | 10/1995 | Umezawa | 361/699 |
| 5,500,540 | 3/1996 | Jewell et al. | 257/82 |
| 5,508,230 | 4/1996 | Anderson et al. | 437/183 |

OTHER PUBLICATIONS

D.L. Barton, "Infrared Light Emission from Semiconductor Devices", *Proc. of the 22nd Internat. Symp. for Testing and Failure Analysis*, pp. 9–17, Nov. 18–22, Los Angeles, CA, Nov. 1996.

S. Hayashi, "Solid Immersion Lens for Optical Storage", *SPIE Symp. on Electronic Imaging Science & Technology*, Report No. 5285, Feb. 5–10, 1995.

D. Voorhes, "Liquid Cooling for DPSS Lasers", *Lasers & Optronics*, Aug., 1996.

*Primary Examiner*—Teresa M. Arroyo
*Attorney, Agent, or Firm*—Blakely, Sokoloff, Taylor & Zafman

[57] ABSTRACT

A method and an apparatus for cooling a semiconductor die. In one embodiment, a C4 packaged semiconductor die is thermally coupled to a cooling plate having an opening. The opening of the cooling plate is disposed over a back side surface of the semiconductor die such that direct unobstructed access to the exposed back side surface of the semiconductor die is provided. A conformable thermal conductor, such as indium, is disposed between the semiconductor die and the cooling plate to improve the thermal coupling between the semiconductor and cooling plate. In one embodiment, the semiconductor die is mounted on a circuit board and a cooling block is disposed on the opposite side of the circuit board. The cooling plate is thermally coupled to the cooling block with heat transfer conduits, such as thermal screws, that extend through the circuit board to transfer the heat from the semiconductor die through the cooling plate through the heat transfer conduits to the cooling block located on the opposite side of the circuit board. In one embodiment, coolant is circulated through the cooling block to remove heat from the cooling block.

27 Claims, 8 Drawing Sheets

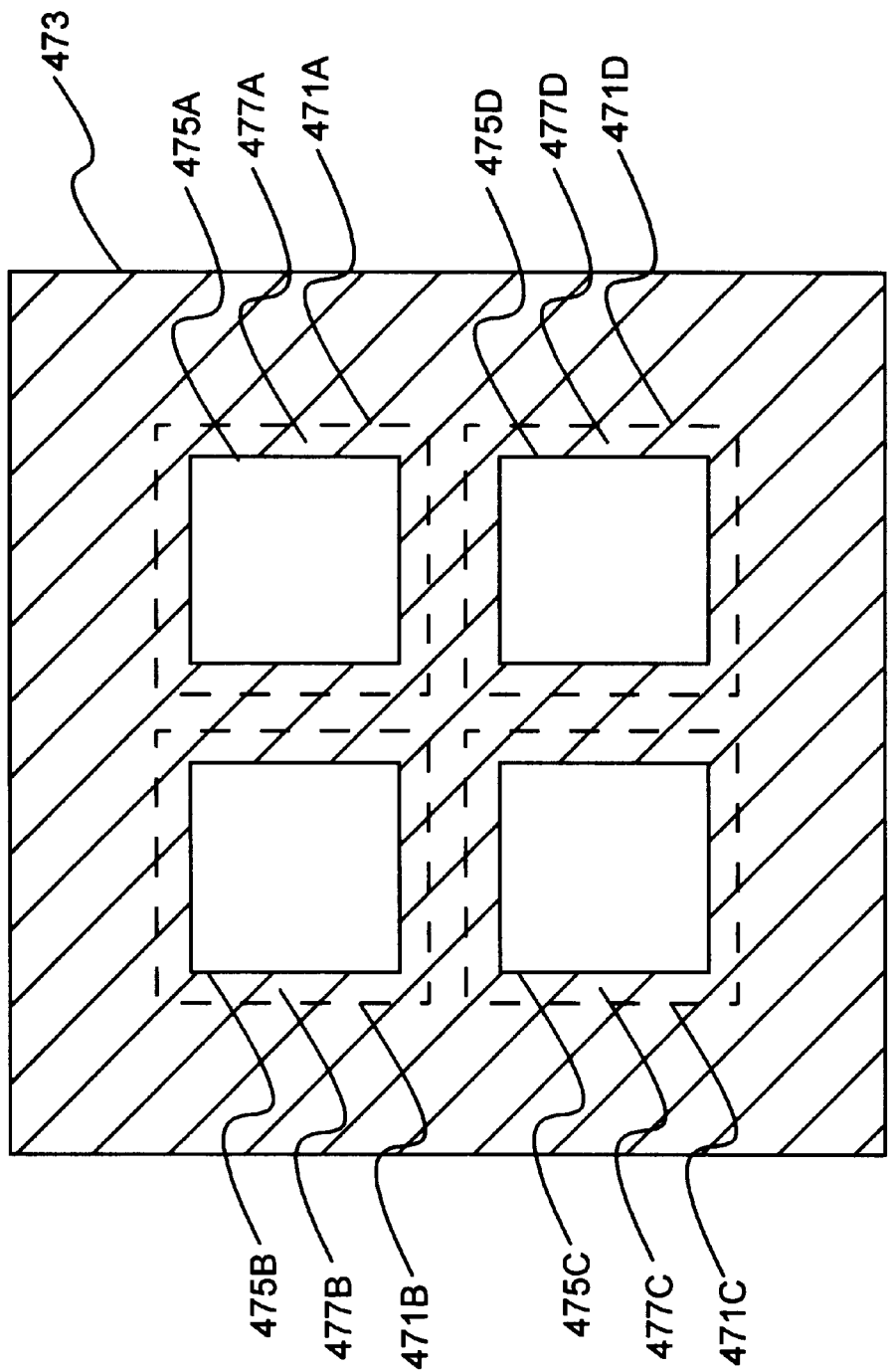

APPARATUS FOR COOLING A SEMICONDUCTOR DIE

BACKGROUND OF THE INVENTION

1. Field of the Invention

The present invention relates generally to integrated circuit technology and, more specifically, the present invention relates to controlling the temperature of an integrated circuit.

2. Background Information

Within the integrated circuit industry there is a continuing effort to increase integrated circuit speed as well as device density. As a result of these efforts, there is a trend towards using flip-chip technology when packaging complex high speed integrated circuits. Flip-chip technology is also known as Control Collapse Chip Connection (C4) packaging. In C4 packaging technology, the integrated circuit die is flipped upside down relative to integrated circuit dies that are packaged using wire bond technology.

During the testing or debugging of an integrated circuit, it is often desirable to operate the integrated circuit in its native packaging environment and at the full intended operating speed of the integrated circuit. Since the power density in modern integrated circuits is typically very high, it is desirable to remove heat generated by these integrated circuits in order to reduce the risk of the integrated circuits from being subjected to excessive heat. If the temperature of the integrated circuit is not properly controlled, the performance of the circuit may be affected. In some instances, component degradation will occur if the temperature of the integrated circuit is not properly regulated. Thus, any debug information collected should be obtained with the temperature of the integrated circuit regulated. Otherwise, any debug information obtained may not be useful.

As depicted in FIG. 1A, the removal of heat from a wire bonded semiconductor device 101 generally involves attaching a finned heat sink 103 to a bottom surface 107 of a package 111 and passing an air flow 109 over heat sink 103. A heat flow path is established across a back side surface 105 of semiconductor device 101 through package 111 and into heat sink 103. A heat slug (not shown) that may be embedded within package 111 thermally couples semiconductor device 101 to heat sink 103. Heat is then carried away by air flow 109 passing across heat sink 103.

FIG. 1B illustrates the removal of heat from a wire bonded semiconductor die 131 during silicon debug. As shown in FIG. 1B, semiconductor die 131 is packaged in a wire bond package 141 that is mounted on a circuit board 145. Probe tool 143 is part of an electron beam (e-beam) system used to debug semiconductor die 131 while operating in a vacuum chamber. With direct unobstructed access to semiconductor die 131, probe tool 143 may be used to obtain information from semiconductor die 131 while operating.

Since semiconductor die 131 is operated in a vacuum, the normal cooling mechanisms that rely on the circulation of air are not available. A cooling technique commonly used in present day e-beam probing systems employs the use of a cooling block 149, which is thermally coupled to a bottom surface 147 of package 141. Heat generated by semiconductor die 131 is transferred through package 141 to cooling block 149. Coolant 151 is circulated through cooling block 149 to regulate the temperature of cooling block 149, and thus regulate the temperature of semiconductor die 131.

FIG. 2 illustrates heat being dissipated from a C4 packaged semiconductor die 201. Heat is removed from a back side surface 205 of semiconductor die 201 by passing an air flow 209 over a finned heat sink 203 that is thermally coupled to back side surface 205. In some high power applications, heat is dissipated from semiconductor die 201 by attaching a thermally conductive heat slug (not shown) to back side surface 205 and then thermally coupling the heat slug to a heat sink (not shown). In some instances, the heat slug is thermally coupled to a metal plate having a large thermal mass and a large heat transfer area. In other instances, the heat slug may be thermally coupled to a heat spreading plate by heat pipe or some other low resistance thermal path. It is noted that heat is generally not dissipated through package 207 as solder bumps 211 are generally not considered to be good thermal conductors. Moreover, package 207 may be an organic package, and therefore have the characteristics of a thermal insulator.

When debugging a semiconductor die 201 with a probing system, such as for example an e-beam system, it is desired that back side surface 205 be exposed to provide direct unobstructed access with the e-beam probe tool. However, as described in FIG. 2, a heat sink 203 is normally utilized in C4 packaging to remove heat from semiconductor die 201. If heat sink 203 is removed from semiconductor die 201 for debug purposes, continuous operation of the integrated circuit during analysis may damage the circuits of semiconductor die 201. In addition, if C4 mounted semiconductor die 201 is operated in a vacuum chamber of an e-beam probing system, the normal cooling mechanisms such as conduction are not available. Without the ability to regulate the temperature of semiconductor die 201, sustained operation of semiconductor die 201 at full operating speeds may result in circuit degradation and/or damage.

SUMMARY OF THE INVENTION

A method and an apparatus for cooling a semiconductor die is disclosed. In one embodiment, a cooling plate having an opening is disposed over a first surface of the semiconductor die such that the cooling plate is thermally coupled to the semiconductor die. Heat is transferred from the semiconductor die to the cooling plate. The opening of the cooling plate is disposed over an exposed portion of the semiconductor die such that unobstructed access to the exposed portion of the semiconductor die is provided. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

FIG. 4C is an illustration of yet another embodiment of a cooling plate having more than opening disposed over the semiconductor dies of a multi-chip module in accordance with the teachings of the present invention.

DETAILED DESCRIPTION

A method and an apparatus for cooling a semiconductor die is disclosed. In the following description numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention.

One embodiment of the present invention provides a method and an apparatus for controlling the temperature of a flip-chip or C4 packaged integrated circuit in a vacuum system without significantly obscuring the exposed circuit substrate. Thus, the embodiment enables probing of a C4 packaged integrated circuit during silicon debug and fault isolation. Temperature control of the semiconductor die of the C4 packaged integrated circuit is realized with one embodiment of the present invention without relying upon thermal conduction through the package and without significantly obscuring the exposed circuit substrate. Temperature control is accomplished in one embodiment by making direct thermal contact with a cooling plate to the exposed substrate of the C4 mounted integrated circuit in such a manner that the thermal conduction of the package does not effect the efficiency of the temperature controlling system. One embodiment of the present invention may be used in the vacuum chamber of a present day e-beam probing system and is compatible with the existing cooling techniques used with wire bond packaged integrated circuits.

Figure 3:
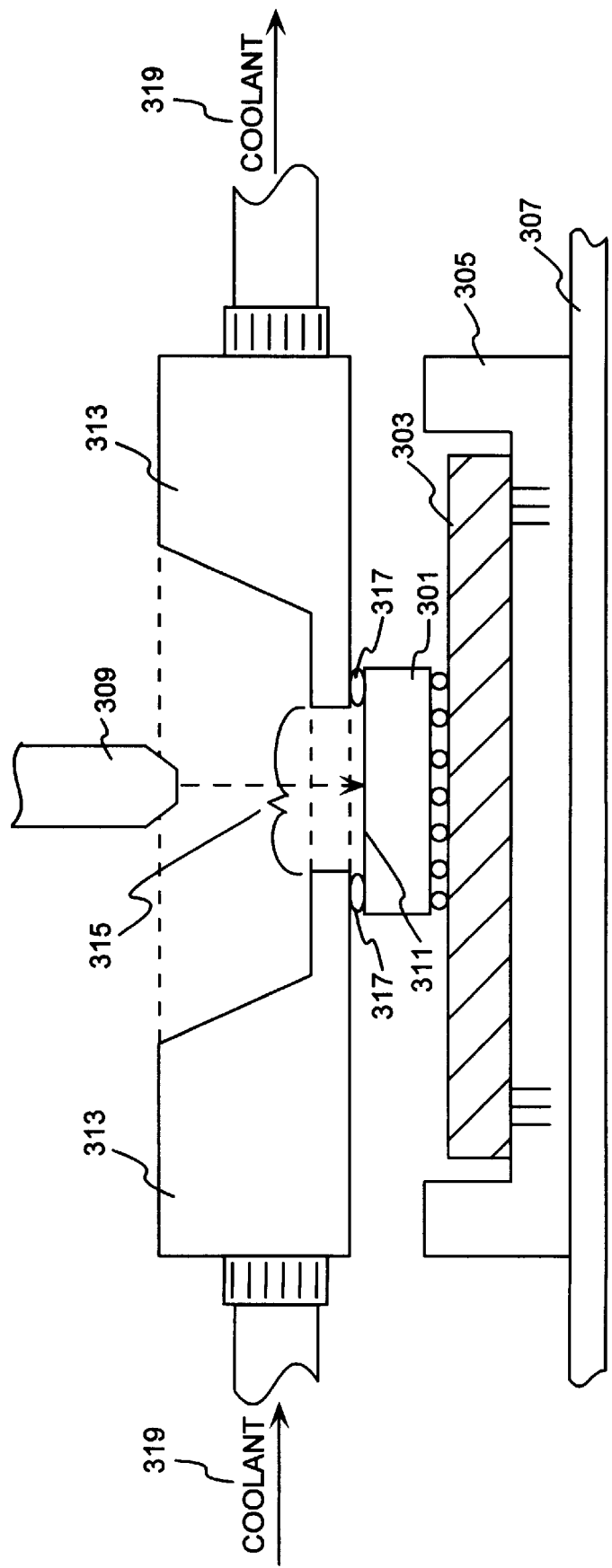
FIG. 3 illustrates a C4 packaged semiconductor device having a cooling plate thermally coupled to a semiconductor die while being probed with a probe tool in accordance with the teachings of the present invention.

FIG. 3 is a side view illustration of a semiconductor die 301 packaged in a C4 package 303. C4 package 303 is mounted in a socket 305 to operate on a circuit board 307. In one embodiment, a probe tool 309 is used to extract information from an exposed back side surface 311 of semiconductor die 301 as shown in FIG. 3. In one embodiment of the present invention, semiconductor die 301 is configured to operate at full intended operating speeds in the vacuum chamber of an e-beam probing system. It is recognized, however, that the present invention is not limited for use in e-beam probing systems and may therefore also be useful in other debugging systems such as for example laser based testing systems, mechanical probing systems, or the like.

In order to regulate the temperature of semiconductor die 301 while operating at full intended operating speeds in a vacuum chamber as well as provide direct unobstructed access to the back side surface 311 of semiconductor die 301, a cooling plate 313 having an opening 315 is placed in direct contact with the exposed substrate of semiconductor die 301 as shown in FIG. 3. With cooling plate 313 in direct contact with the exposed substrate of semiconductor die 301, heat is transferred from semiconductor die 301 to cooling plate 313 through the thermal coupling at the interface between semiconductor die 301 and cooling plate 313. With opening 315, probe tool 309 has direct unobstructed access to the back side surface 311 of semiconductor die 301 for silicon debug and fault isolation purposes.

In some instances, the interface contact surfaces between semiconductor die 301 and cooling plate 313 may not be planar. As a consequence, the thermal coupling between cooling plate 313 and semiconductor die 301 would consist only of point contacts. In this situation, the thermal conductivity between semiconductor die 301 and cooling plate 313 is reduced thereby increasing the thermal resistance between semiconductor die 301 and cooling plate 313. In this instance, the efficiency of the presently described temperature controlling system is reduced.

In one embodiment, a malleable or pliable thermal conductor is disposed at the interface between semiconductor die 301 and cooling plate 313 to increase the thermal conductivity between semiconductor die 301 and cooling plate 313. In one embodiment, indium, or an indium alloy, is utilized as the malleable thermal conductor so as to provide a conformable thermal interface so as to increase the thermal conductivity and reduce the thermal resistance between cooling plate 313 and semiconductor die 301. Indium is particularly useful for this aspect of the present invention due to its high thermal conductivity, malleable characteristics and low melting temperature. Furthermore, indium is vacuum compatible, which makes it well suited for use in the vacuum chambers of e-beam probing systems.

In one embodiment, a thin layer of indium 317 is disposed around the edges of the back side surface 311 of semiconductor die 301 at locations where cooling plate 313 will eventually be in contact with semiconductor die 301. In one embodiment, indium 317 is an indium foil. After the indium 317 is placed at the edges of semiconductor die 301, it is melted and cooling plate 313 is then pressed against semiconductor die 301 such that a very conformable coating of indium 317 is formed between semiconductor die 301 and cooling plate 313. In another embodiment, indium 317 is not melted before cooling plate 313 is pressed against semiconductor die 301. Thus, a conformable thermal interface with increased thermal conductivity is formed between semiconductor die 301 and cooling plate 313.

Other malleable thermal conductors may be used in place of indium in accordance with the teachings of the present invention so long as a conformable thermal contact is formed between semiconductor die 301 and cooling plate 313. For example, a thermal paste may be used instead of indium 317 to improve the thermal coupling between semiconductor die 301 and cooling plate 313. It is recognized, however, that some thermal pastes are not particularly well suited for use in vacuums due to their out gas properties.

In one embodiment of the present invention, the portion of cooling plate 313 disposed above semiconductor die 301 is thinned to approximately 1 mm. In doing so, probe tool 309 is provided increased access and maneuverability to extract information the back side surface 311 of semiconductor die 301 during debug testing or fault isolation.

In one embodiment of the present invention, coolant 319 is circulated through cooling plate 313 in order to regulate the temperature of cooling plate 313. Thus, the heat generated by semiconductor die 301 may be transferred to cooling plate 313 and then out of cooling plate 313 through coolant 319 to an external cooler (not shown) in accordance with teachings of the present invention.

Figure 4A:
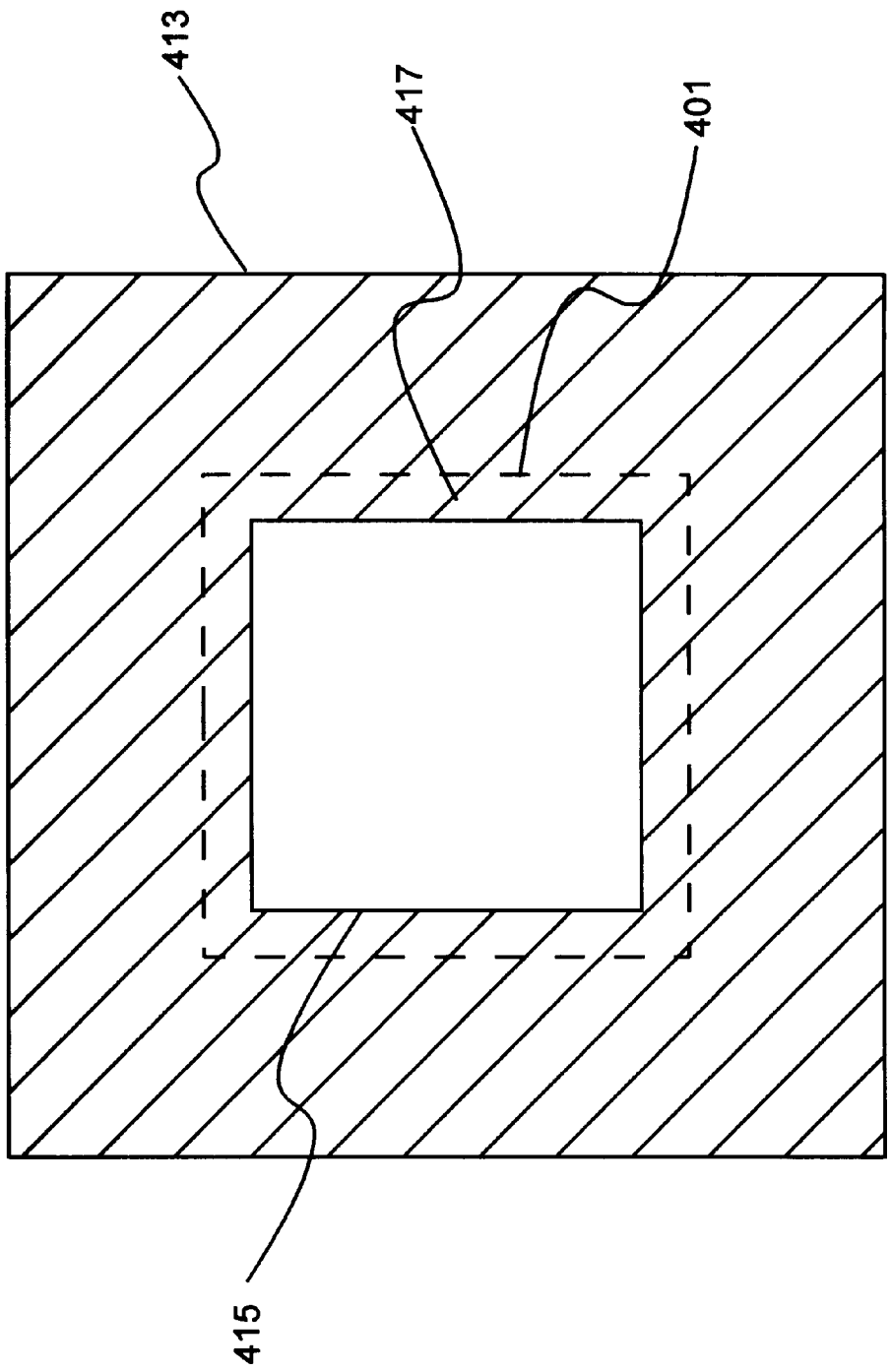
FIG. 4A is a top view illustration of a cooling plate having an opening disposed over a semiconductor die in accordance with the teachings of the present invention.

FIG. 4A is a top view illustration of a cooling plate 413 having an opening 415 disposed over and thermally coupled to a semiconductor die 401 in accordance with the teachings of the present invention. In one embodiment, the dimensions of opening 415 are smaller than the outer dimensions of the edges of semiconductor die 401 such that semiconductor die 401 is thermally coupled to cooling plate 413 at an interface contact region 417 located on the back side surface of semiconductor die 401. In one embodiment, a malleable thermal conductor such as indium is disposed between cooling plate 413 and semiconductor die 401 in interface contact region 417 to increase the thermal coupling between semiconductor die 401 and cooling plate 413. Thus, probing tools such as an e-beam probe or a laser based testing system have direct unobstructed access to the exposed circuit substrate on the back side of semiconductor die 401 through opening 415.

Figure 4B:
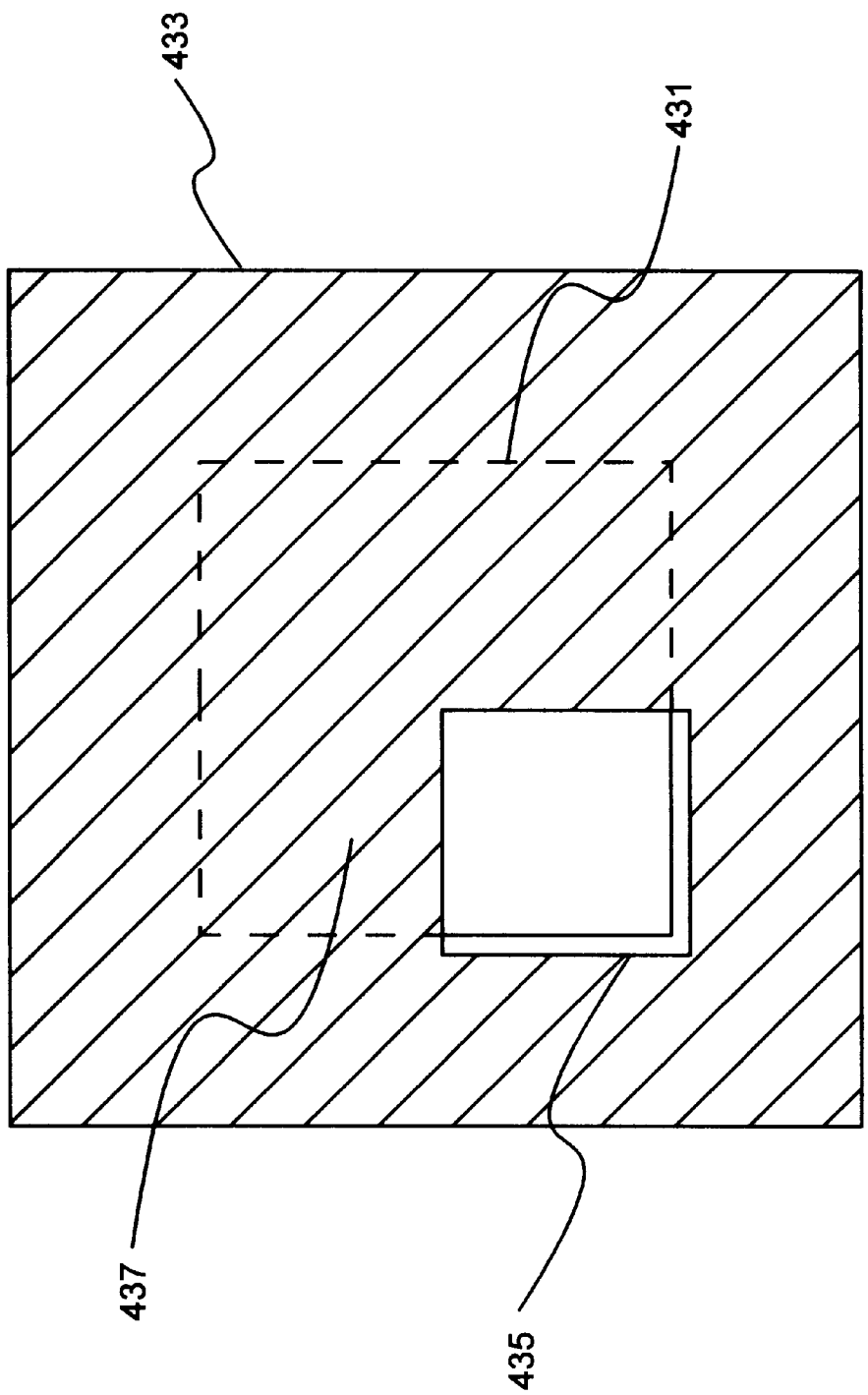
FIG. 4B is a top view illustration of another embodiment of a cooling plate having an opening disposed over a semiconductor die in accordance with the teachings of the present invention.

FIG. 4B is a top view illustration of another embodiment of the present invention in which a cooling plate 433 having an opening 435 is disposed over and thermally coupled to a semiconductor die 431. As shown in FIG. 4B, opening 435 is configured to expose an entire corner of semiconductor die 431. In the embodiment illustrated, semiconductor die 431 is thermally coupled to cooling plate 433 in an interface contact region 437. It is appreciated that in the embodiment shown in 4B, direct unobstructed access is provided to the entire exposed corner of semiconductor die 431, including the edges of the exposed corner of semiconductor die 431 for probing purposes. In this embodiment, it is appreciated that direct unobstructed access to any portion of the back side surface of semiconductor die 431 may be realized by rotating semiconductor die 431 with respect to cooling plate 433 such that the desired portion of the back side of semiconductor die 431 is exposed through opening 435.

Similar to the embodiments described earlier, a malleable thermal conductor may be disposed between cooling plate 433 and semiconductor die 431 in the interface contact region 437. In doing so, the thermal conductivity between semiconductor die 431 and cooling plate 433 is increased, thus increasing the thermal coupling between semiconductor die 431 and cooling plate 433. By increasing the thermal coupling, the temperature gradient across semiconductor die 431 may be reduced.

FIG. 4C is a top view illustration of yet another embodiment of the present invention with a cooling plate 473 having openings 475A–D. In the embodiment shown, each opening 475A–D is configured to be disposed over a corresponding back side surface of semiconductor dies 471A–D. In this embodiment, semiconductor dies 471A–D are included in a multi-chip module (MCM) unit. Each semiconductor die 471A–D is thermally coupled to cooling plate 473 such that heat is transferred from each respective semiconductor die 471A–D to a cooling plate 473. Each opening 475A–D is disposed over a corresponding semiconductor die 471A–D such that direct unobstructed access is provided to an exposed portion of the back side of each semiconductor die 471A–D. Accordingly, probing may be performed in the exposed portion of each semiconductor die 471A–D for silicon debug in fault isolation purposes.

As shown in FIG. 4C, heat is transferred from silicon die 471A to cooling plate 473 through an interface contact region 477A. Heat is transferred from semiconductor die 471B to cooling plate 473 through an interface contact region 477B. Heat is transferred from semiconductor die 471C to cooling plate 473 through an interface contact region 477C. Heat is transferred from semiconductor die 471D to cooling plate 473 through an interface contact region 477D. Similar to the embodiments described earlier, a malleable thermal conductor such as indium is disposed between semiconductor dies 471A–D and cooling plate 473 in interface contact regions 477A–D to increase the thermal coupling between cooling plate 473 and each respective semiconductor die 471A–D.

It is appreciated that the present invention is not limited to cooling plates having only the shapes and openings described with respect to FIGS. 4A–C and that cooling plates and openings having other shapes may therefore be used so long as the semiconductor dies are cooled without significantly obscuring the exposed semiconductor die in accordance with the teachings of the present invention.

Figure 1A:
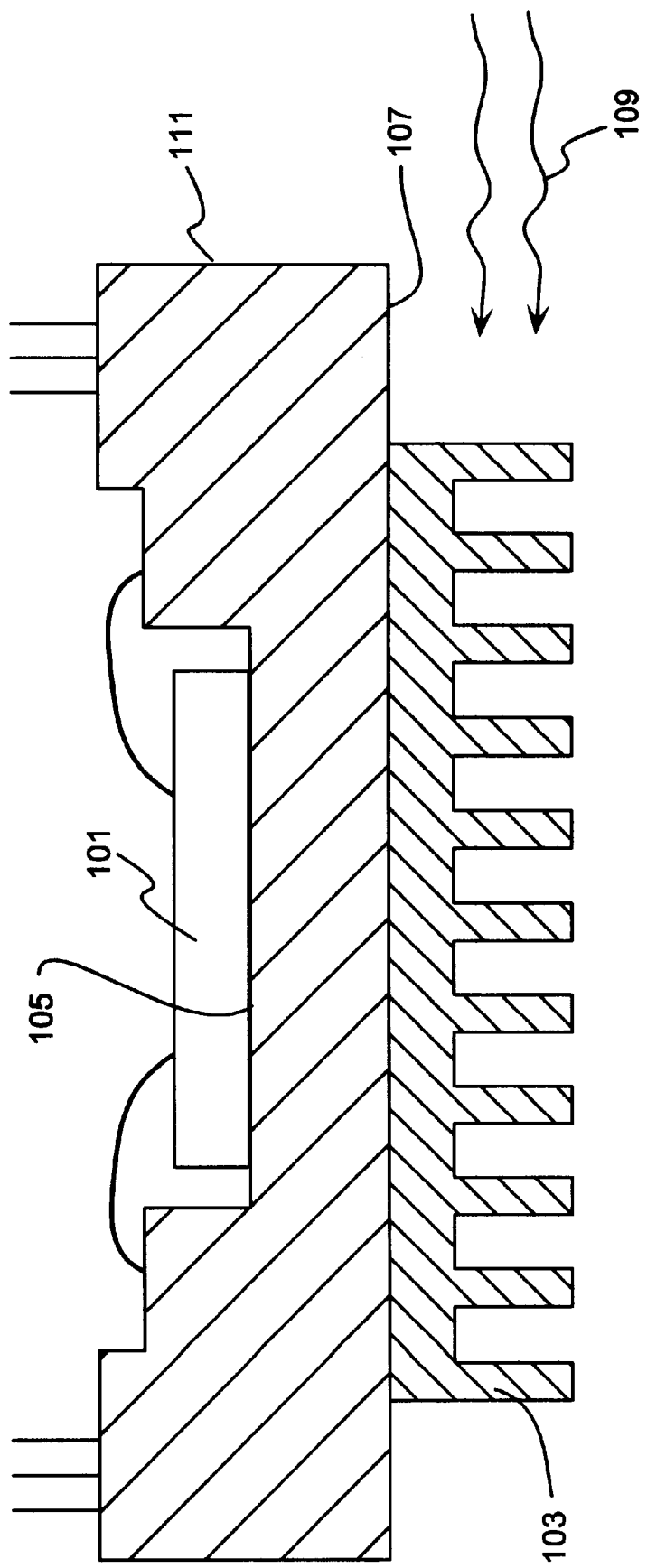
FIG. 1A illustrates a wire bond packaged semiconductor device having a finned heat sink attached to the back side of the package.
Figure 1B:
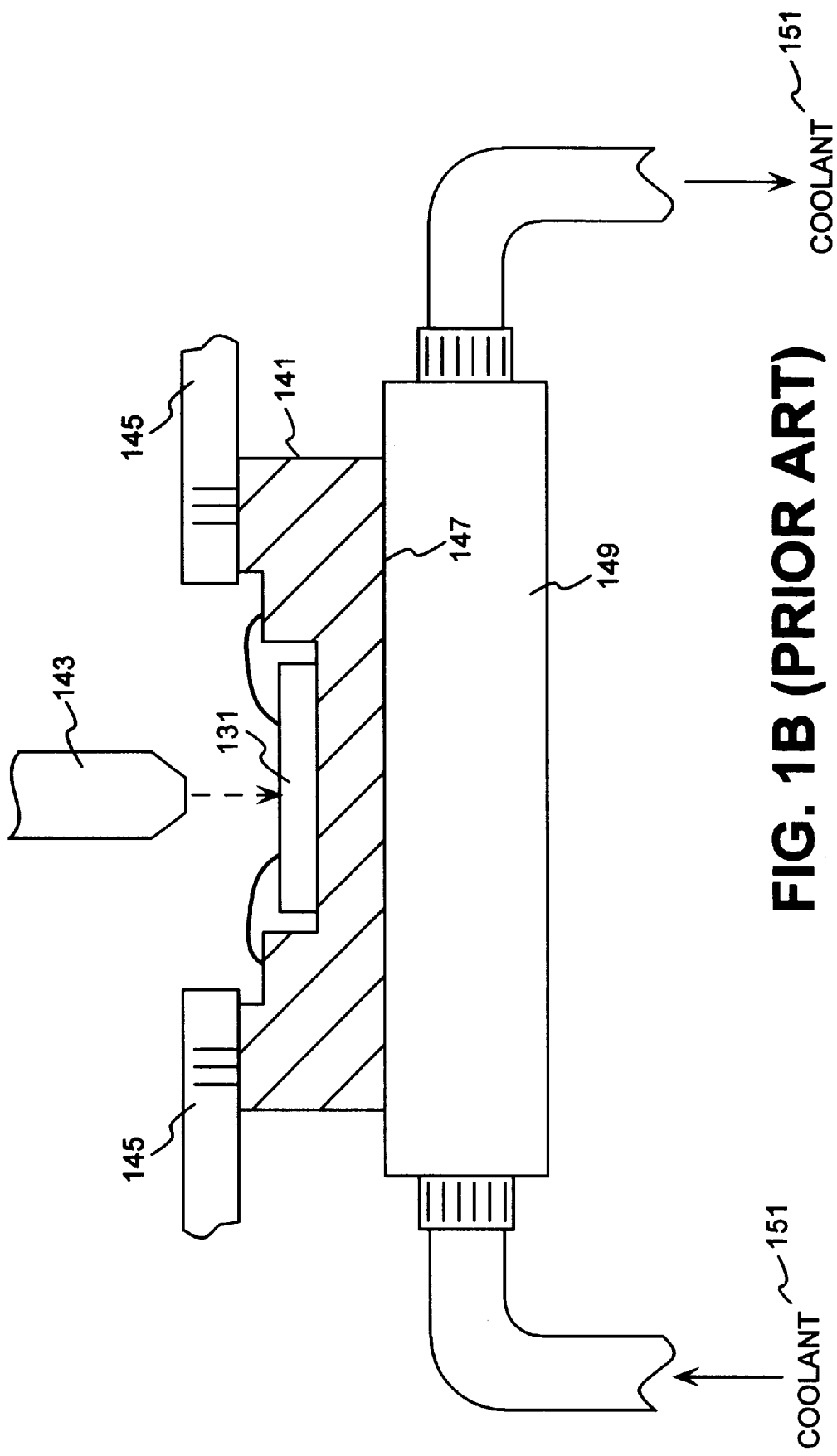
FIG. 1B illustrates a wire bond packaged semiconductor device being probed during debug and cooled with a cooling block attached to the back side of the package.
Figure 2:
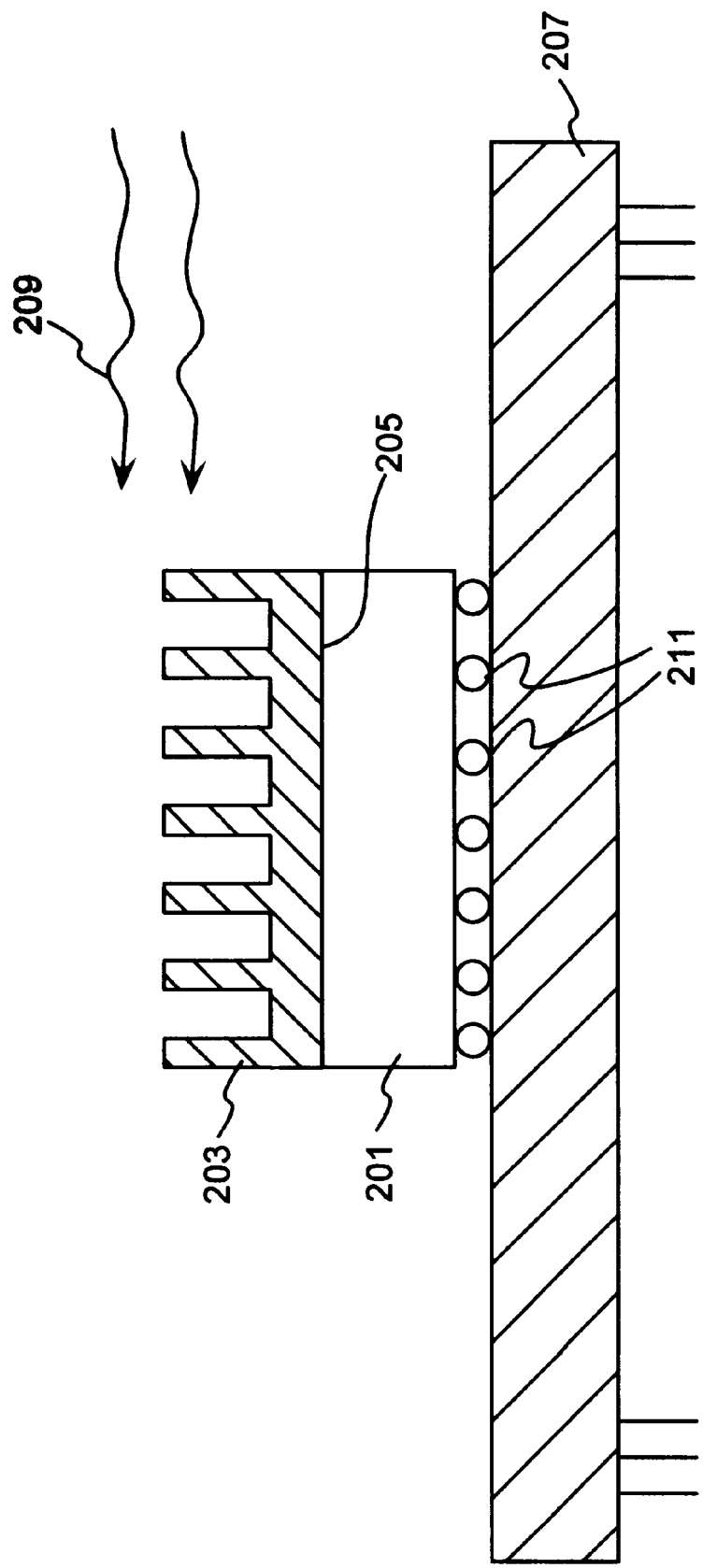
FIG. 2 illustrates a C4 packaged semiconductor device having a finned heat sink attached to the back side of the semiconductor substrate.
Figure 5:
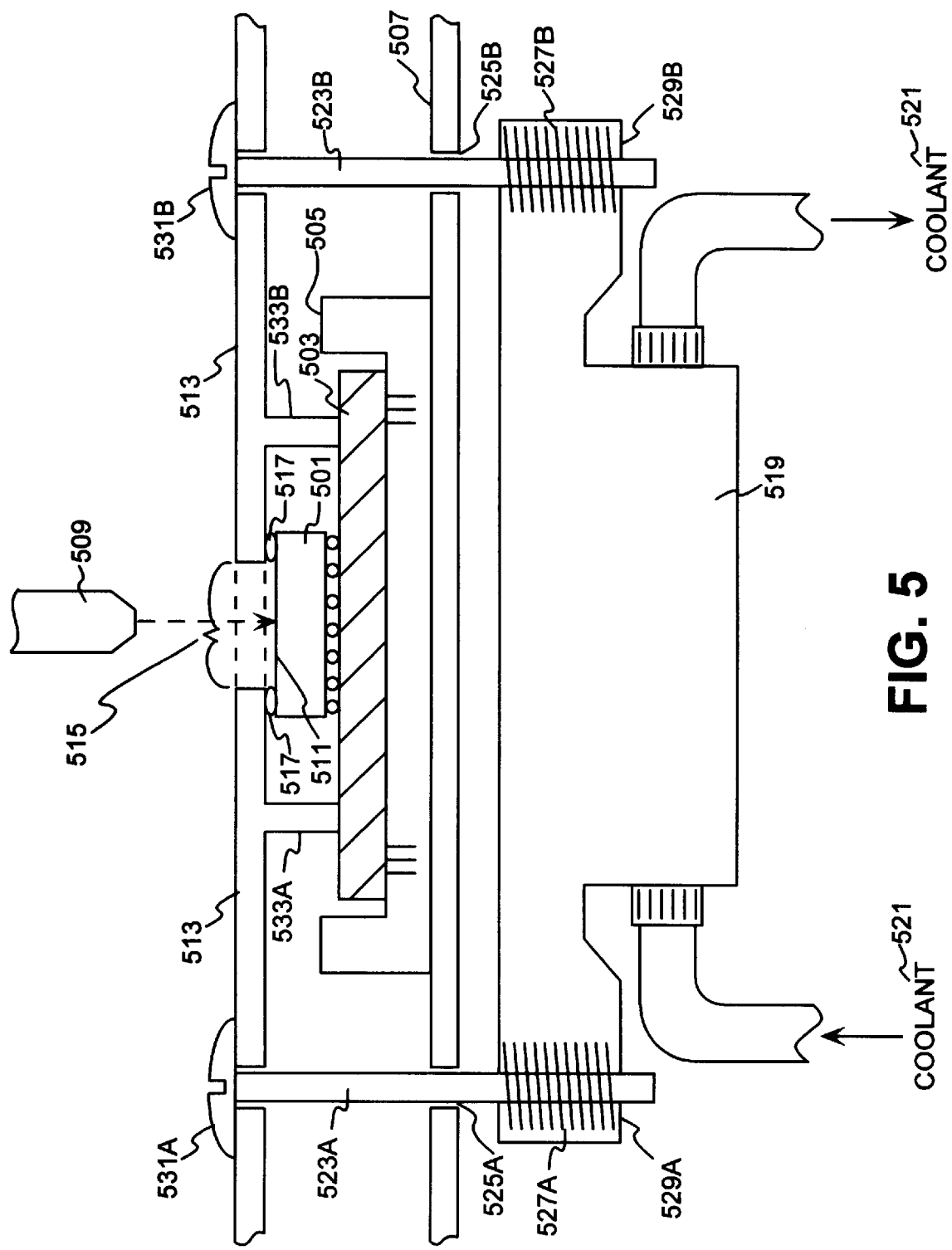
FIG. 5 is an illustration of a C4 packaged semiconductor device thermally coupled to a cooling plate that is thermally coupled to a cooling block through a heat transfer conduit in accordance with the teachings of the present invention.

FIG. 5 is an illustration of another embodiment of a method and apparatus for cooling a semiconductor die in accordance with the teachings of the present invention. In the embodiment shown in FIG. 5, a semiconductor die 501 is packaged in a C4 package 503, which is mounted in a socket 505 mounted on a circuit board 507. Similar to the system described with respect to FIG. 1B, semiconductor die 501 may be operated in the vacuum chamber of an e-beam probing system for silicon debug and fault isolation purposes.

In accordance with the teachings of the present invention, a cooling plate 513 having an opening 515 is disposed over and thermally coupled to semiconductor die 501. Opening 515 is disposed over a back side surface 511 of semiconductor die 501 thus providing direct and unobstructed access for a probe tool 509 to the exposed portion of the back side surface 511 of semiconductor die 501. In one embodiment of the present invention, a malleable thermal conductor such as indium 517 is disposed between semiconductor die 501 and cooling plate 513 in the interface contact region to provide a conformable thermal contact between semiconductor die 501 and cooling plate 513 such that the thermal coupling between semiconductor die 501 and cooling plate 513 is increased. Therefore, the heat generated by semiconductor die 501 while operating at full intended operating speeds is transferred to cooling plate 513 through indium 517.

In one embodiment, the present invention may be compatible with the temperature control systems of present day e-beam probing systems in which a cooling block 519 is disposed on the opposite side of circuit board 507. Referring to FIG. 5, probe tool 509 probes semiconductor die 501, which is mounted on circuit board 507. However, cooling block 519 is located on the opposite side of circuit board 507 as is the case with many existing e-beam probing systems that are configured to probe wire bond packaged integrated circuits. In accordance with the teachings of the present invention, cooling plate 513 is thermally coupled to cooling block 519 through heat transfer conduits 523A and 523B.

In one embodiment, heat transfer conduits 523A–B include thermal screws that extend from cooling plate 513 through openings 525A and 525B respectively in circuit board 507 to cooling block 519. In one embodiment, cooling block 519 includes threaded holes 529A and 529B configured to receive the threads 527A and 527B of heat transfer conduits 523A and 523B respectively. As such, heat transfer conduits 523A and 523B thermally couple cooling plate 513 to cooling block 519 such that heat is transferred from semiconductor die 501 through cooling plate 513, through heat transfer conduits 523A–B to cooling block 519.

In one embodiment, the thermal screws of heat transfer conduits 523A and 523B include oversized heads 531A and 531B respectively as well as oversized threads 527A and 527B respectively. With the oversized heads 531A and 531B, the amount of surface area in which heat transfer conduits 523A and 523B are in thermal contact with cooling plate 513 is increased so as to decrease thermal resistance as well as increase thermal conductivity. Similarly, with the oversized threads 527A and 527B, the amount of surface area in which heat transfer conduits 523A and 523B are in thermal contact with cooling block 519 is increased therefore reducing thermal resistance and increasing thermal conductivity.

In another embodiment of the present invention, cooling plate 513 includes features 533A and 533B located on circuit board 507 side of cooling plate 513 such that features 533A and 533B tend to push C4 package 503 into socket 505 of circuit board 507 when the thermal screws of heat transfer conduits 523A and 523B are tightened. As such, it is more likely that C4 package 503 is properly seated in socket 505 after thermal screws of heat transfer conduits 523A and 523B are tightened. In addition, it is appreciated that the thermal screws of heat transfer conduits 523A and 523B also allow adjusting of the plane of cooling plate 513 to the plane of the back side surface 511 of semiconductor die 501 so as to further increase thermal contact through indium 517.

In one embodiment of the present invention, cooling plate 513 includes copper with a nickel coating. In another embodiment of the present invention, the thermal screws of heat transfer conduits 523A and 523B are also made of copper. It is recognized that copper is particularly well suited for the present application since copper is a good thermal conductor. It is noted however that the present invention is not limited to a cooling plate 513 and heat transfer conduits 523A and 523B that are made of copper and that other materials may therefore be used so long as cooling plate 513 and heat transfer conduits 523A and 523B have sufficient thermal conductivity to cool semiconductor die 501 in accordance with the teachings of the present invention. In another embodiment of the present invention, coolant 521 is circulated through cooling block 519 to further facilitate the removal of heat from semiconductor die 501.

Thus, what has been described is a method and an apparatus for cooling a semiconductor die. With the presently described cooling method and apparatus, C4 mounted integrated circuits or MCM units may be operated in a vacuum chamber of an e-beam probing system for a silicon debug and fault isolation. The presently described cooling method and apparatus also provide cooling to C4 mounted integrated circuits or MCM units operated outside a vacuum chamber during laser based tests or mechanical probing. The presently described apparatus and method cool the semiconductor die without relying upon thermal conduction through package and without significantly obscuring the exposed circuit substrate of the C4 or MCM units. Furthermore, the present invention is compatible with existing temperature control systems in present day e-beam probing systems typically configured to cool the semiconductor dies through their respective packages.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A device for cooling a semiconductor die, comprising:
   a cooling plate having an opening, the cooling plate disposed over a first surface of the semiconductor die, the cooling plate thermally coupled to the semiconductor die at an interface at the first surface such that heat is transferred from the semiconductor die to the cooling plate, the cooling plate opening disposed over an exposed portion of the first surface such that unobstructed access to a substantial area of the exposed portion of the first surface is provided.

2. The device described in claim 1 further comprising:
   a conformable thermal conductor disposed between the semiconductor die and the cooling plate at the interface, the conformable thermal conductor formed to conform with corresponding opposing surfaces of the cooling plate and the semiconductor die so as to reduce a thermal resistance between the cooling plate and the semiconductor die.

3. The device described in claim 2 wherein the conformable thermal conductor is a malleable thermal conductor comprising indium.

4. The device described in claim 1 wherein the cooling plate has another opening, the cooling plate further disposed over a first surface of another semiconductor die, the cooling plate thermally coupled to the other semiconductor die at another interface at the first surface of the other semiconductor die such that heat is also drawn from the other semiconductor die to the cooling plate, the other opening of the cooling plate disposed over an exposed portion of the first surface of the other semiconductor die such that unobstructed access to the exposed portion of the first surface of the other semiconductor die is also provided.

5. The device described in claim 4 wherein the semiconductor die and the other semiconductor die are included in a multi-chip module.

6. The device described in claim 1 wherein coolant is circulated through the coolant plate so as to cool the coolant plate.

7. The device described in claim 1 wherein the semiconductor die operates on a circuit board, the device further comprising:
   a cooling block disposed on an opposite side of the circuit board relative to the semiconductor die; and
   a heat transfer conduit thermally coupled between the cooling plate and the cooling block such that heat is transferred from the cooling plate to the cooling block through the heat transfer conduit.

8. The device described in claim 7 wherein the heat transfer conduit comprises a screw thermally coupling the cooling plate and the cooling block.

9. The device described in claim 8 wherein the screw includes an oversized screw head and oversized threads so as to reduce a thermal resistance between the screw and the cooling plate and the cooling block.

10. The device described in claim 8 wherein the screw is configured to clamp the semiconductor die to the circuit board.

11. The device described in claim 8 wherein the screw comprises copper.

12. The device described in claim 7 wherein coolant is circulated through the coolant block so as to cool the coolant block.

13. The device described in claim 1 wherein the cooling plate comprises copper.

14. The device described in claim 1 wherein the semiconductor die is included in a control collapse chip connection (C4) mounted integrated circuit.

15. A device for cooling a semiconductor die, comprising:
   a cooling plate having a opening, the cooling plate disposed over a first surface of the semiconductor die, the cooling plate thermally coupled to the semiconductor die at an interface at the first surface such that heat is transferred from the semiconductor die to the cooling plate the cooling plate opening disposed over an exposed portion of the first surface such that unobstructed access to a substantial area of the exposed portion of the first surface is provided; and a conformable thermal conductor disposed between the semiconductor die and the cooling plate at the interface, the conformable thermal conductor formed to conform with corresponding opposing surfaces of the cooling plate and the semiconductor die so as to reduce a thermal resistance between the cooling plate and the semiconductor die.

16. The device described in claim 15 wherein the conformable thermal conductor is a malleable thermal conductor comprising indium.

17. The device described in claim 16 wherein the cooling plate is positioned such that a portion of the first surface is exposed such that unobstructed access to the exposed portion of the first surface is provided.

18. The device described in claim 15 wherein coolant is circulated through the coolant plate so as to cool the coolant plate.

19. The device described in claim 15 wherein the semiconductor die operates on a circuit board, the device further comprising:

a cooling block disposed on an opposite side of the circuit board relative to the semiconductor die; and a heat transfer conduit thermally coupled between the cooling plate and the cooling block such that heat is transferred from the cooling plate to the cooling block through the heat transfer conduit.

20. The device described in claim 19 wherein the heat transfer conduit comprises a screw thermally coupling the cooling plate and the cooling block.

21. The device described in claim 20 wherein the screw includes an oversized screw head and oversized threads so as to reduce a thermal resistance between the screw and the cooling plate and the cooling block.

22. The device described in claim 20 wherein the screw is configured to clamp the semiconductor die to the circuit board.

23. The device described in claim 19 wherein coolant is circulated through the coolant block so as to cool the coolant block.

24. A device for cooling a semiconductor die operating on a circuit board, comprising:

a cooling plate disposed over a first surface of the semiconductor die, the cooling plate thermally coupled to the semiconductor die at an interface at the first surface such that heat is transferred from the semiconductor die to the cooling plate;

a cooling block disposed on an opposite side of the circuit board relative to the semiconductor die; and a heat transfer conduit thermally coupled between the cooling plate and the cooling block such that heat is transferred from the cooling plate to the cooling block through the heat transfer conduit.

25. The device described in claim 24 further comprising:

a conformable thermal conductor disposed between the semiconductor die and the cooling plate at the interface, the conformable thermal conductor formed to conform with corresponding opposing surfaces of the cooling plate and the semiconductor die so as to reduce a thermal resistance between the cooling plate and the semiconductor die.

26. The device described in claim 25 wherein the conformable thermal conductor is a malleable thermal conductor comprising indium.

27. The device described in claim 24 wherein the cooling plate includes an opening such that the cooling plate opening is disposed over an exposed portion of the first surface so as to provide unobstructed access to the exposed portion of the first surface.

* * * * *